United States Patent
Oohira

(10) Patent No.: US 7,965,367 B2
(45) Date of Patent: Jun. 21, 2011

(54) DISPLAY DEVICE HAVING FLEXIBLE PRINTED CIRCUIT BOARD WITH PARTICULAR DIFFERENTIAL SIGNAL LINES CONNECTION

(75) Inventor: Eiji Oohira, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 337 days.

(21) Appl. No.: 12/379,030

(22) Filed: Feb. 11, 2009

(65) Prior Publication Data
US 2009/0207367 A1    Aug. 20, 2009

(30) Foreign Application Priority Data
Feb. 15, 2008   (JP) ................................ 2008-034733

(51) Int. Cl.
*G02F 1/1345* (2006.01)
(52) U.S. Cl. ......... 349/150; 349/149; 349/151; 349/152
(58) Field of Classification Search .................. 349/150, 349/149, 151, 152
See application file for complete search history.

(56) References Cited

U.S. PATENT DOCUMENTS

| 7,012,667 B2 * | 3/2006 | Pai ................................ 349/152 |
| 7,463,325 B2 * | 12/2008 | Oohira ........................... 349/149 |
| 2007/0132909 A1 * | 6/2007 | Oohira ............................ 349/58 |

FOREIGN PATENT DOCUMENTS

| JP | 2007-114444 | 10/2005 |
| JP | 2007-163556 | 12/2005 |

* cited by examiner

*Primary Examiner* — Mike Qi
(74) *Attorney, Agent, or Firm* — Stites & Harbison PLLC; Juan Carlos A. Marquez, Esq.

(57) ABSTRACT

A display device which can prevent a drawback that a positive signal line and a negative signal line are separated to left and right sides of an external connector thus generating impedance mismatching in differential signals is provided. The flexible printed circuit board has a group of differential signal lines including plural pairs of differential signal lines which transmits differential signals, the flexible printed circuit board is constituted of a first portion which includes first connection terminals which are electrically and mechanically connected with electrodes formed on the first substrate, and a second portion which is contiguously formed with the first portion and includes second connection terminals which are connected with the external connector, a pair of GND lines is arranged on both sides of a positive signal line and a negative signal line of each pair of differential signal lines in the first portion and the second portion, and an additional GND line is arranged at least between the positive signal line and the negative signal line of said each pair of differential signal lines in the second portion.

11 Claims, 11 Drawing Sheets

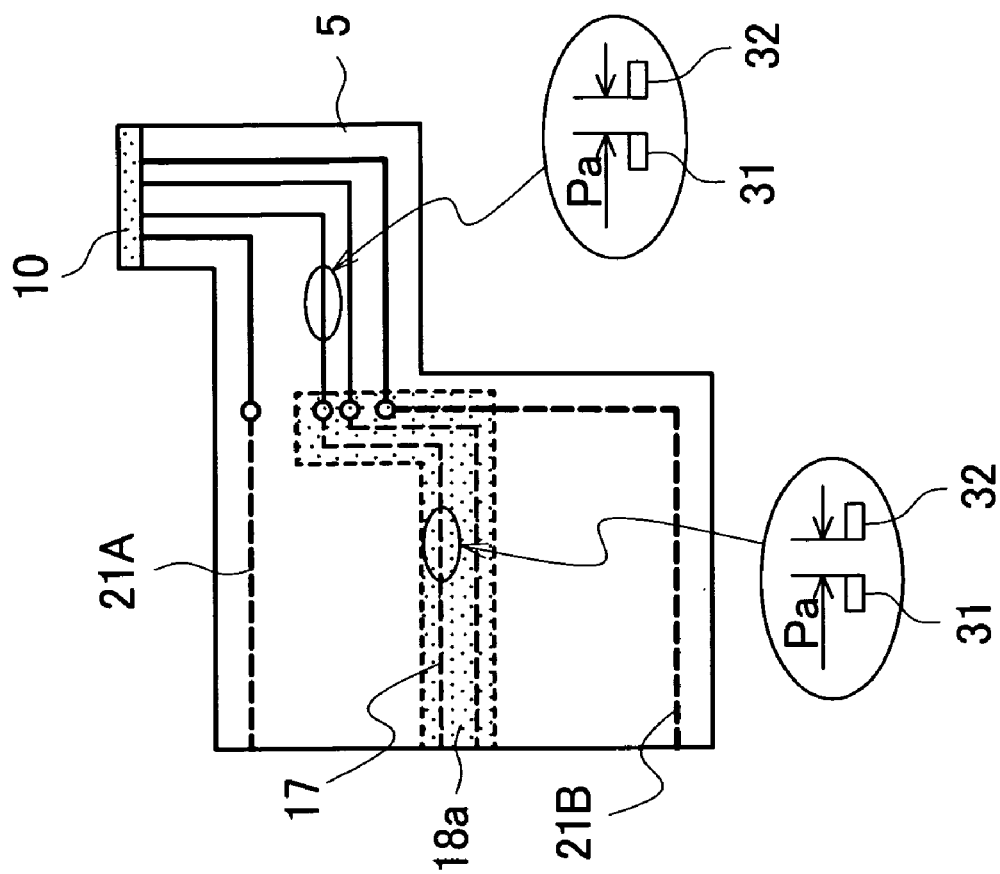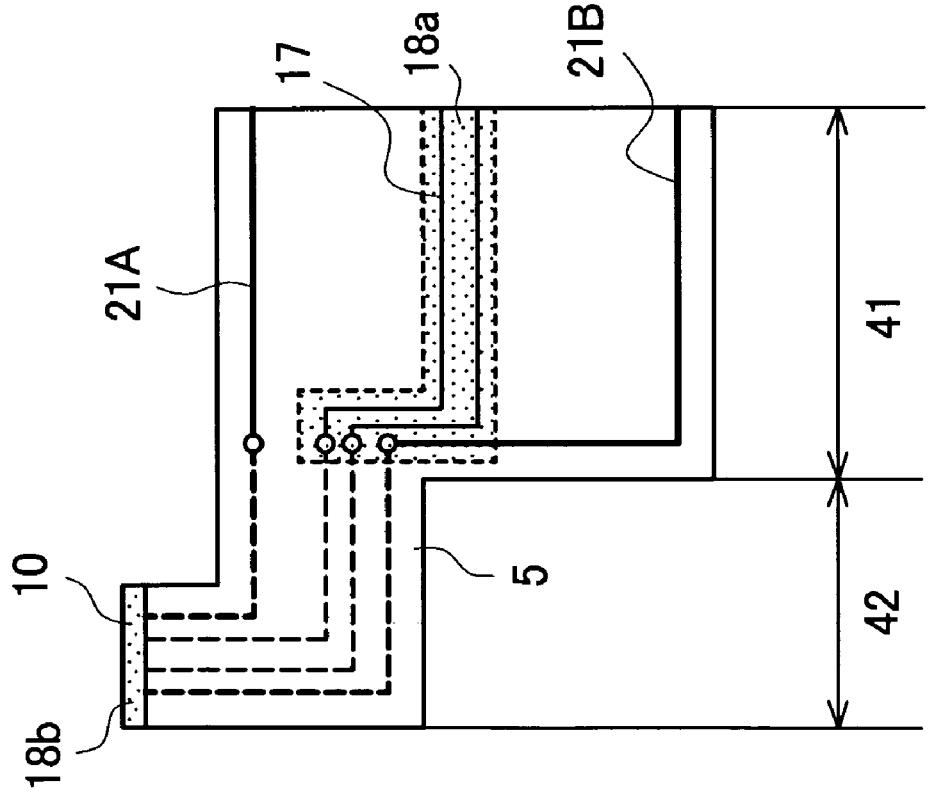

DISPLAY DEVICE HAVING FLEXIBLE PRINTED CIRCUIT BOARD WITH PARTICULAR DIFFERENTIAL SIGNAL LINES CONNECTION

CROSS-REFERENCE TO RELATED APPLICATIONS

The disclosure of Japanese Patent Application No. 2008-34733 filed on Feb. 15, 2008 including the specification, drawings and abstract is incorporated herein by reference in its entirety.

BACKGROUND OF THE INVENTION

1. Field of the Invention

The present invention relates to a display device, and more particularly to a technique which is effectively applicable to the transmission of signals between a host computer side and a display panel using a high-speed differential signal method.

2. Description of the Related Art

A TFT (Thin Film Transistor)-type liquid crystal display module which is used as a display part of portable equipment such as a mobile phone includes a miniaturized liquid crystal display panel and a resin mold frame which houses the liquid crystal display panel therein, and the liquid crystal display panel is housed in a recessed portion formed in the resin mold frame.

The liquid crystal display panel includes a first substrate, a second substrate, and a liquid crystal layer which is sandwiched between the first substrate and the second substrate. Respective planar shapes of the first and second substrates are formed in a rectangular shape having long sides and short sides, wherein the long side of the first substrate is longer than the long side of the second substrate and hence, the first substrate has a region where the first substrate does not overlap with the second substrate (hereinafter referred to as a non-overlapping region).

A semiconductor chip which mounts a driver circuit therein is mounted on the non-overlapping region of the first substrate, and one-end side of a flexible printed circuit board is connected to the non-overlapping region of the first substrate. Such a liquid crystal display panel is described in, for example, Japanese Patent Laid-Open No. 2007-114444 (patent document 1) and Japanese Patent Laid-Open No. 2007-163556 (patent document 2).

SUMMARY OF THE INVENTION

Recently, with respect to a liquid crystal display panel of a mobile phone described in the above-mentioned patent document 1 and patent document 2, there has been a demand for the transmission of high-speed differential signals on the flexible printed circuit board which can be realized by incorporating a function of outputting high-speed differential signals in a processor of the mobile phone (a transmitter circuit) and by incorporating a function of receiving the high-speed differential signals in a semiconductor chip of the liquid crystal display panel (a receiver circuit).

However, when high-speed differential signal lines are connected with connection terminals (interface terminals) which are connected with an external connector in accordance with transmission circuit rules of high-speed differential signals described later, even when either one of a ZIF-type connector or a stacking-type connector is used as the external connector, a positive signal line and a negative signal line for transmitting the high-speed differential signals are separated to left and right sides of the external connector thus giving rise to a drawback that impedance mismatching is generated in the high-speed differential signals.

On the other hand, among commercially-available external connectors, there has been known a connector exclusively used for high-speed differential signals which is constituted of a metal-made shield cover and the like. With the use of such a connector, a positive signal line and a negative signal line for transmitting the high-speed differential signals are separated to left and right sides of the external connector and hence, it is possible to obviate the generation of impedance mismatching in the differential signals. However, the incorporation of such a connector exclusively used for high-speed differential signals into portable equipment such as a mobile phone has drawbacks in view of a size and a specification of the portable equipment.

The present invention has been made to overcome the above-mentioned drawbacks of the related art, and it is an object of the present invention to provide a technique in which a positive signal line and a negative signal line for transmitting the high-speed differential signals are separated to left and right sides of an external connector thus preventing the generation of impedance mismatching in differential signals.

The above-mentioned and other objects and novel features of the present invention will become apparent from the description of this specification and attached drawings.

To briefly explain the summary of typical inventions among inventions described in this specification, they are as follows.

(1) A display device includes: a display panel (for example, a liquid crystal display panel) having at least a first substrate; and a flexible printed circuit board which is mechanically and electrically connected with an edge portion of at least one side of the first substrate, wherein the flexible printed circuit board has a group of differential signal lines including plural pairs of differential signal lines which transmits differential signals, the flexible printed circuit board is constituted of a first portion which includes first connection terminals which are electrically and mechanically connected with electrodes formed on the first substrate, and a second portion which is contiguously formed with the first portion and includes second connection terminals which are connected with an external connector, a pair of GND lines is arranged on both sides of a positive signal line and a negative signal line of each pair of differential signal lines in the first portion and the second portion, and an additional GND line is arranged at least between the positive signal line and the negative signal line of the above-described each pair of the differential signal lines in the second portion.

(2) In the display device having the above-mentioned constitution (1), in the second portion, the additional GND line is arranged between the positive signal line and the negative signal line of each pair of the differential signal lines, between a GND line which is arranged between differential signal lines of each pair arranged adjacent to each other and the positive signal line or the negative signal line of one pair of the neighboring respective pairs of differential signal lines.

(3) In the display device having the above-mentioned constitution (1), in the second portion, the additional GND line is arranged between the positive signal line and the negative signal line of each pair of the differential signal lines, between one of one pair of the GND lines and the positive signal line of each pair of the differential signal lines, and between another of one pair of the GND lines and the negative signal line of each pair of the differential signal lines.

(4) In the display device having any one of the above-mentioned constitutions (1) to (3), the positive signal line and the negative signal line of each pair of the differential signal lines, the pair of the GND lines, and a second connection terminal of the additional GND line are arranged in a staggered manner.

(5) In the display device having any one of the above-mentioned constitutions (1) to (4), the group of differential signal lines is formed on a first surface of the flexible printed circuit board, a GND pattern is formed on a second surface of the flexible printed circuit board opposite to the first surface of the flexible printed circuit board, and one end of the additional GND line on a side opposite to the connection terminal of the additional GND line is connected to the GND pattern.

(6) In the display device having any one of the above-mentioned constitutions (1) to (3), the group of differential signal lines is formed on a first surface of the flexible printed circuit board, a first GND mesh pattern and a second GND mesh pattern are formed on a second surface of the flexible printed circuit board on a side opposite to the first surface of the flexible printed circuit board, the first GND mesh pattern is formed so as to cover at least the group of differential signal lines, one end of the additional GND line on a side opposite to the connection terminal is connected to the first GND mesh pattern, the second GND mesh pattern is formed on a region other than a region where the first GND mesh pattern is formed, and the second GND mesh pattern has a mesh size set larger than a mesh size of the first GND mesh pattern.

(7) In the display device having the constitution (6), the group of differential signal lines is formed on the first surface in the first portion of the flexible printed circuit board and is formed on the second surface in the second portion of the flexible printed circuit board, the first GND mesh pattern and the second GND mesh pattern are formed only in the first portion of the flexible printed circuit board, a third GND pattern is formed on the first surface of the second portion of the flexible printed circuit board, the third GND pattern is formed so as to cover at least a region on which the additional GND line is formed, and one end of the additional GND line on a side opposite to the connection terminal is connected to the third GND pattern.

(8) In the display device having any one of the above-mentioned constitutions (1) to (3), the group of differential signal lines is formed on a first surface of the flexible printed circuit board, a first GND pattern and a second GND pattern are respectively formed on a first portion and a second portion of a second surface of the flexible printed circuit board on a side opposite to the first surface of the flexible printed circuit board, the first GND pattern and the second GND pattern are not electrically connected with each other, the second GND pattern is formed so as to cover at least a region where the additional GND line is formed, and one end of the additional GND line on a side opposite to the connection terminal is connected to the second GND pattern.

(9) In the display device having any one of the above-mentioned constitutions (1) to (4), the group of differential signal lines is formed on the first surface in the first portion of the flexible printed circuit board and is formed on the second surface opposite to the first surface in the second portion of the flexible printed circuit board, a first GND pattern and a second GND pattern are respectively formed on the second surface of the first portion of the flexible printed circuit board and the first surface of the second portion of the flexible printed circuit board, the first GND pattern and the second GND pattern are not electrically connected with each other, the second GND pattern is formed so as to cover at least a region where the additional GND line is formed, and one end of the additional GND line on a side opposite to the connection terminal is connected to the second GND pattern.

(10) In the display device having any one of the above-mentioned constitutions (7) to (9), a distance between the positive signal line and the negative signal line of each pair of the differential signal lines in the first region is set narrower than a distance between the positive signal line and the negative signal line of each pair of the differential signal lines in the second region.

To briefly explain the advantageous effect obtained by typical inventions among the inventions disclosed in this specification, they are as follows.

According to the present invention, it is possible to prevent a drawback that the positive signal line and the negative signal line which constitute the differential signal lines are separated to left and right sides of an external connector thus generating impedance mismatching in differential signal lines.

BRIEF DESCRIPTION OF THE DRAWINGS

FIG. 14 is a view showing a modification of a flexible printed circuit board according to the embodiment of the present invention.

DETAILED DESCRIPTION OF THE INVENTION

Hereinafter, an embodiment in which the present invention is applied to a liquid crystal display device is explained in detail in conjunction with attached drawings.

Here, in all drawings for explaining the embodiment, parts having identical functions are given same symbols and their repeated explanation is omitted.

The liquid crystal display device according to the embodiment of the present invention is a TFT-type liquid crystal display module having a miniaturized liquid crystal display panel, and is used as a display part of portable equipment such as a mobile phone.

Figure 1:
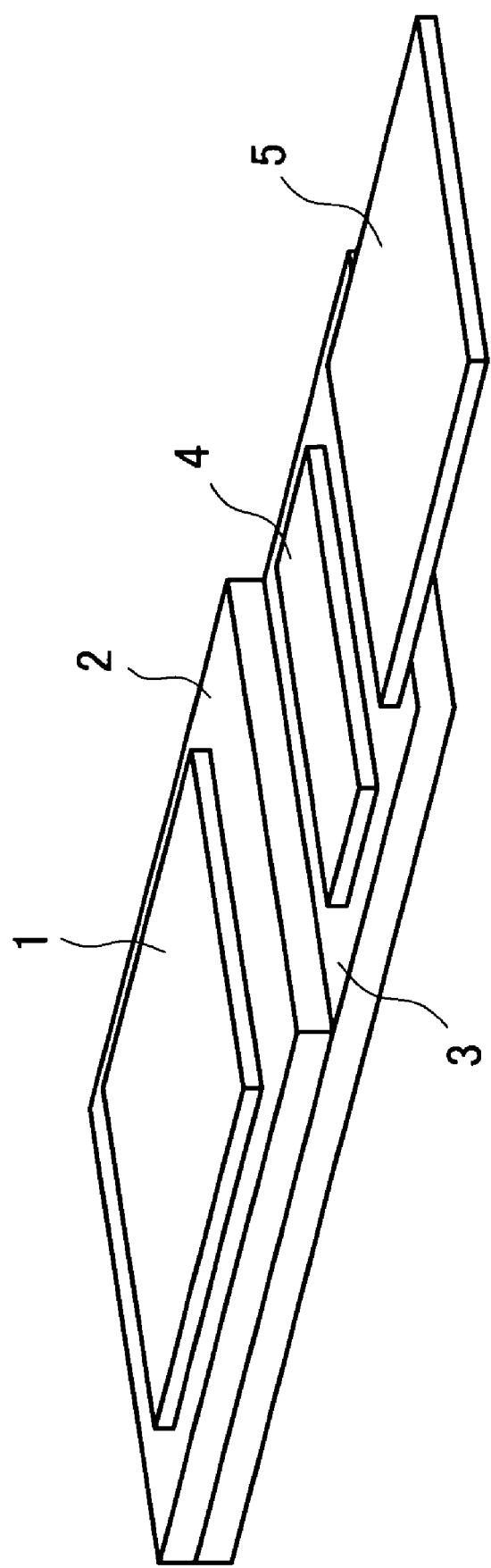
FIG. 1 is a block diagram showing the schematic constitution of a liquid crystal display panel of the liquid crystal display module according to an embodiment of the present invention.

FIG. 1 is a block diagram showing the schematic constitution of a liquid crystal display panel of the liquid crystal display module according to the embodiment of the present invention.

As shown in FIG. 1, the liquid crystal display panel of this embodiment is configured such that a first substrate (also referred to as a TFT substrate or an active matrix substrate) 3 on which pixel electrodes, thin film transistors and the like are mounted and a second substrate (also referred to as a counter substrate) 2 on which color filters and the like are formed overlap with each other with a predetermined gap therebetween, both substrates are laminated to each other by a sealing material which is formed in a frame shape in the vicinity of the peripheral portion between both substrates, liquid crystal is filled and sealed in a space defined between both substrates and the sealing material through a liquid crystal filling port formed in a portion of the first substrate 3, a lower polarizer (not shown in the drawing) is laminated to an outer side of the first substrate 3, and an upper polarizer 1 is laminated to an outer side of the second substrate 2.

In this manner, the liquid crystal display panel of this embodiment has the structure in which the liquid crystal is sandwiched between the pair of substrates.

Further, the first substrate 3 has an area larger than an area of the second substrate 2, a semiconductor chip 4 which constitutes a driver circuit is mounted on a region of the first substrate 3 where the first substrate 3 does not face the second substrate 2 in an opposed manner, and a flexible printed circuit board (FPC) 5 is mounted on a peripheral portion of one side of the region. Here, it is sufficient that these substrates are formed of an insulating material, and a material of the substrate is not limited to glass, and may be plastics or the like.

Further, counter electrodes are formed on a counter substrate side when the liquid crystal display panel is of a TN type or a VA type. When the liquid crystal display panel is of an IPS type, the counter electrodes are formed on a TFT substrate side.

Since the present invention is irrelevant to the inner structure of the liquid crystal display panel, the detailed explanation of the inner structure of the liquid crystal display panel is omitted. Further, the present invention is applicable to a liquid crystal display panel having any structure.

Further, although the liquid crystal display module of this embodiment includes a backlight which is arranged on a back side of the liquid crystal display panel, the present invention is irrelevant to the inner structure of the backlight and hence, the detailed explanation of the inner structure of the backlight is omitted.

Figure 2:
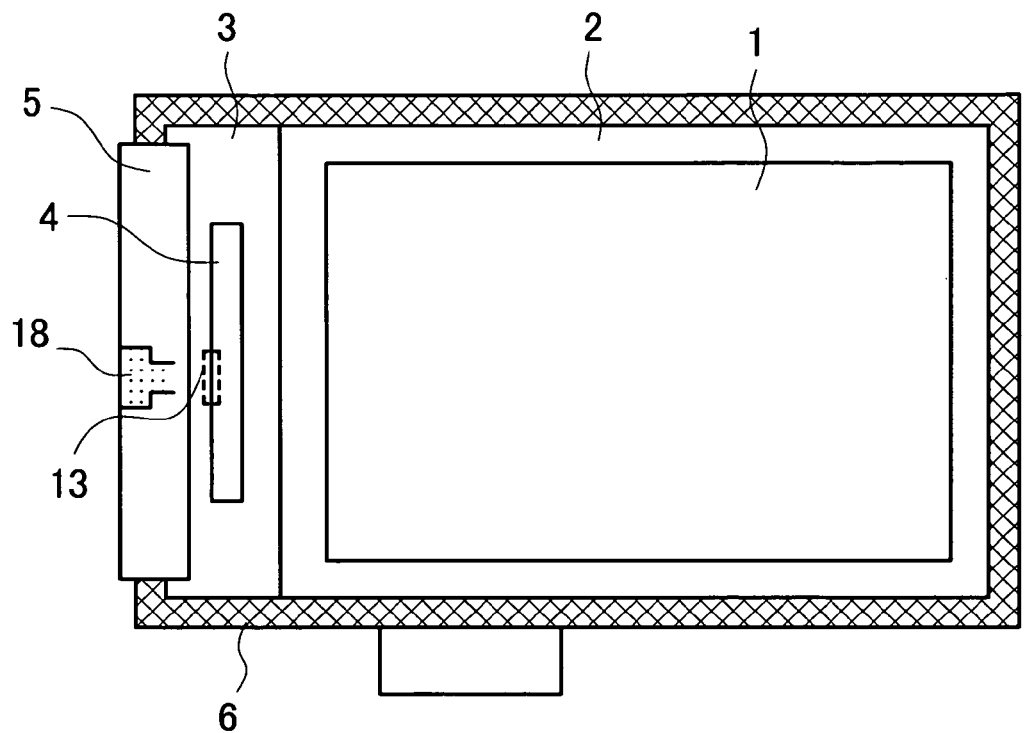
FIG. 2 is a view showing a front side (liquid-crystal-display-panel side, front-surface side, viewer's side) of the liquid crystal display module according to the embodiment of the present invention.
Figure 3:
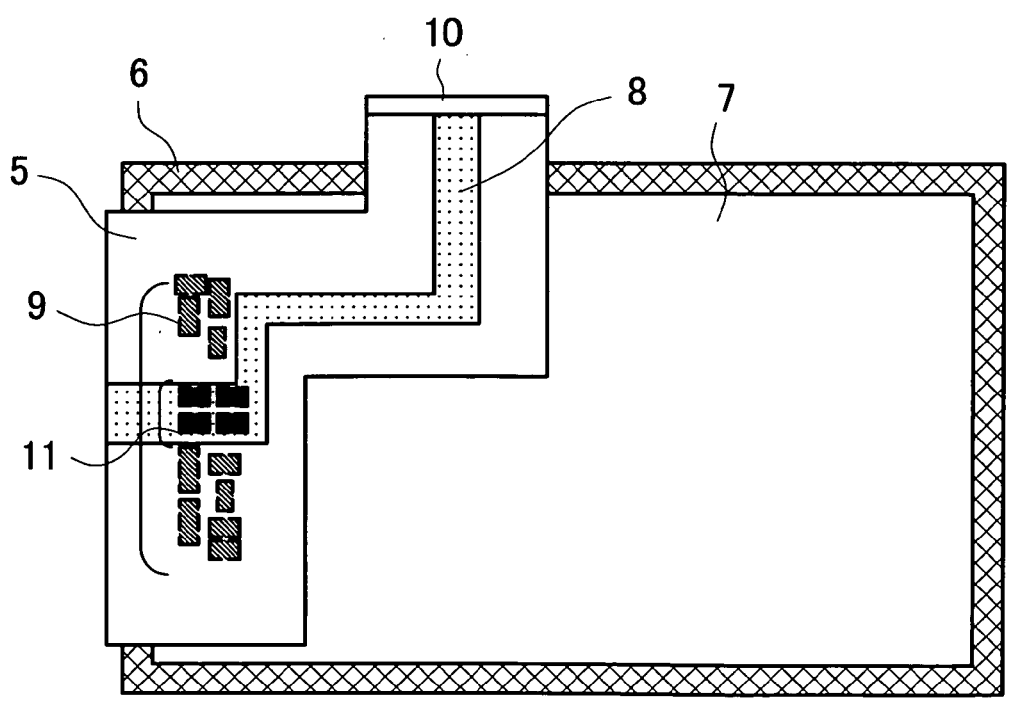
FIG. 3 is a view showing a back side (light-guide-plate side, back-surface side, backside) of the liquid crystal display module according to the embodiment of the present invention.
Figure 4:
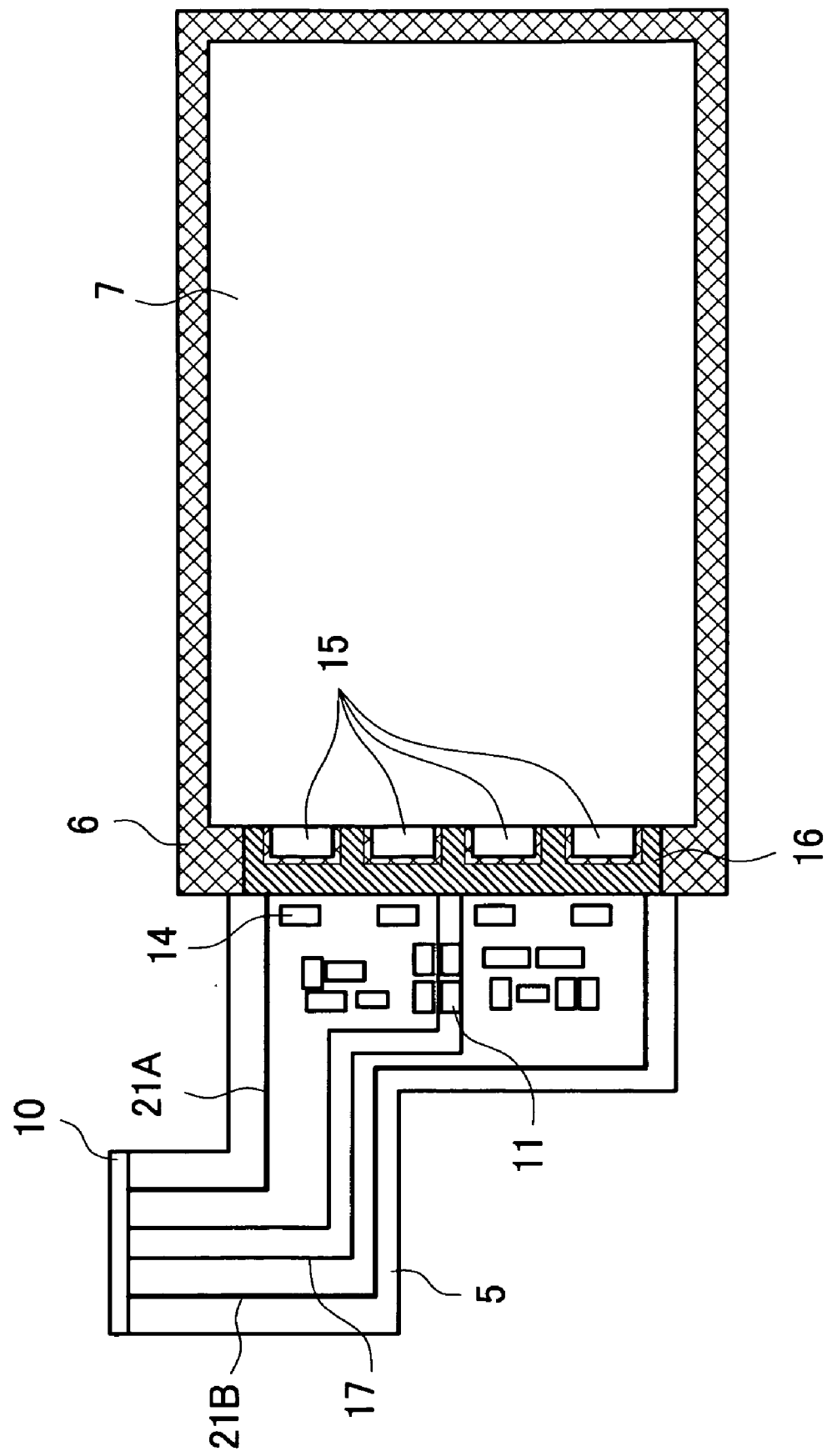
FIG. 4 is a view showing a state in which a flexible printed circuit board is developed in FIG. 3.

FIG. 2 is a view showing a front side (liquid-crystal-display-panel side, front-surface side, viewer's side) of the liquid crystal display module according to the embodiment of the present invention, FIG. 3 is a view showing a back side (light-guide-plate side, back-surface side, back side) of the liquid crystal display module according to the embodiment of the present invention, and FIG. 4 is a view showing a state in which a flexible printed circuit board 5 is developed in FIG. 3.

As shown in FIG. 2 to FIG. 4, the liquid crystal display panel which is constituted of the first substrate 3 and the second substrate 2 is arranged in the inside of a resin mold frame (a resin formed body, hereinafter, simply referred to as a mold) 6. Further, a reflective sheet 7 is arranged on a back side of the mold 6 in a state that the reflective sheet 7 is laminated to a side wall of the mold 6.

Here, the flexible printed circuit board 5 is folded back such that a connection terminal portion 10 which is connected with a phone body portion projects from a back side of the liquid crystal display module to the side surface. Further, on a first surface of the flexible printed circuit board 5, a group of high-speed differential signal lines 17, and a group of lines (21A, 21B) which are arranged on both sides of the group of high-speed differential signal lines 17 are formed. Further, four white light emitting diodes (LED) which constitute a light source are mounted on the first surface of the flexible printed circuit board 5. Although the group of high-speed differential signal lines 17 is constituted of plural pairs of lines, only two lines are shown in FIG. 4. In the same manner, although the group of lines (21A, 21B) is also constituted of a plurality of lines, only one line is shown in FIG. 4.

Further, on the first surface of the flexible printed circuit board 5, electronic parts 9 such as resistors and capacitors, and the group of high-speed differential signal terminal resistors 11 are formed. Still further, on a second surface of the flexible printed circuit board 5 opposite to the first surface, a GND pattern (usually formed of a mesh pattern) 18 for high-speed differential signals (constituting a first GND mesh pattern of the present invention) is formed. Here, the group of high-speed differential signal terminal resistors 11 is constituted of four terminal resistors.

Further, four white light emitting diodes 14 are arranged in the inside of a space 15 formed in the mold 6. Numeral 16 indicates a double-sided adhesive tape for adhering the flexible printed circuit board 5and the mold 6 to each other, and numeral 13 indicates a position of input electrodes (bump electrodes) to which high-speed differential signals are inputted from the semiconductor chip 4.

In a vacant region on the flexible printed circuit board 5 where no lines are present, for the purpose of suppressing partial shrinkage of the flexible printed circuit board 5 attributed to heat history in a part soldering step and for the purpose of shielding electromagnetic waves radiated from lines, a GND pattern (usually formed of a mesh pattern) (constituting a second GND mesh pattern of the present invention; not shown in the drawing) is matted. The GND pattern has a relatively large mesh size so as to easily correct warping with a hand or the like when the flexible printed circuit board 5 is warped after the soldering step. The size of mesh is mainly set to 0.1 mm×0.1 mm.

On the other hand, the GND mesh pattern 18 for high-speed differential signals which is used for impedance matching of high-speed differential signals usually has, for emphasizing electric properties, a mesh size smaller than the mesh size of the GND mesh pattern formed on the flexible printed circuit board 5. That is, the mesh size of the GND mesh pattern 18 for high-speed differential signals is set smaller than 0.1 mm×0.1 mm. Here, a planar GND pattern may be adopted in place of the GND mesh pattern 18 for high-speed differential signals.

Hereinafter, a transmission method of high-speed differential signals is explained in conjunction with FIG. 5. Symbol B in FIG. 5 indicates a region outside the liquid crystal display module of this embodiment, symbol A1 in FIG. 5 indicates a region of the liquid crystal display module of this embodiment, symbol A2 in FIG. 5 indicates a region of the first substrate 3, and symbol PAS in FIG. 5 indicates a region of the flexible printed circuit board 5.

In this embodiment, an output function of high-speed differential signals (transmitter circuit (OCS)) is incorporated in a processor of the mobile phone and, at the same time, a reception function of high-speed differential signals (receiver circuit (RES)) is incorporated in the inside of the semiconductor chip 4. The high-speed differential signals are transmitted between the transmitter circuit (OCS) and the receiver circuit (RES) in the inside of the semiconductor chip 4.

Although various methods are known as the high-speed differential signal method, the high-speed differential signal method adopted by this embodiment is an MVI3 interface method.

In general, although a positive signal line 31 and a negative signal line 32 constitutes a pair line in the high-speed differential signal method, in the MVI3 interface method, four sets of pair lines each of which is constituted of the positive signal line 31 and the negative signal line 32 are present. A terminal resistance 33 is connected between the positive signal line 31 and the negative signal line 32. Accordingly, the group of high-speed differential signal terminal resistors 11 shown in FIGS. 3 and 4 is constituted of four terminal resistances 33.

Further, wiring rules of the MVI3 interface method are as follows.

(1) Characteristic impedance (Zdif) between the pair line consisting of the positive signal line 31 and the negative signal line 32 is set to 100Ω, while both of characteristic impedance between the positive signal line 31 and a GND (ground terminal) and characteristic impedance between the negative signal line 32 and the GND are set to 50Ω. Accordingly, in forming the pair line consisting of the positive signal line 31 and the negative signal line 32 on the first surface of the flexible printed circuit board 5, in the region on the second surface of the flexible printed circuit board 5 where the pair line consisting of the positive signal line 31 and the negative signal line 32 is formed, it is necessary to form a GND matted wiring pattern (a planar pattern) or a GND mesh wiring pattern.

Figure 6:
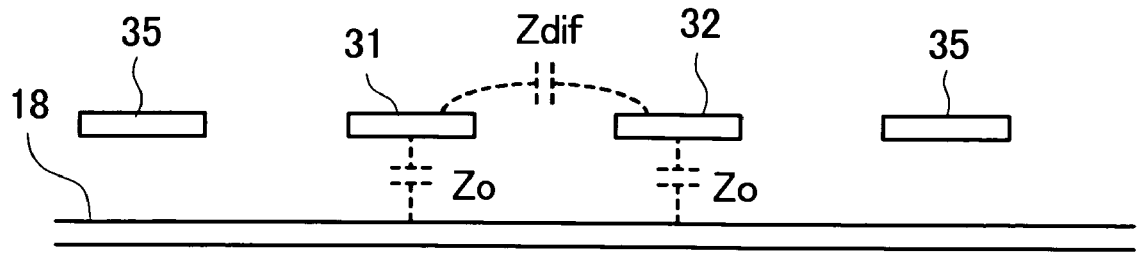
FIG. 6 is a view for explaining a positive signal line and a negative signal line which constitute a pair line and a GND line in the transmission method of high-speed differential signals.

Further, as shown in FIG. 6, it is necessary to arrange a GND line 35 on both sides of the positive signal line 31 and the negative signal line 32 which constitute a pair line.

In this manner, in the region where the group of high-speed differential signal lines 17 is formed, for achieving impedance matching, it is necessary to arrange the GND region (usually realized by the mesh pattern) such that the GND region covers a whole region where the group of high-speed differential signal lines 17 is formed on a surface of the flexible printed circuit board 5 opposite to a surface on which the group of high-speed differential signal lines 17 is formed.

However, for emphasizing the electric characteristics, it is usually necessary to make the mesh size of the GND mesh pattern 18 for impedance matching of high-speed differential signals smaller than a mesh size of a standard GND mesh pattern formed on the flexible printed circuit board 5.

Accordingly, in correcting warping, deformation or the like of the flexible printed circuit board 5 using a hand after a step in which parts of the flexible printed circuit board 5 are soldered (solder reflow step) and a solder mounting step which follows the solder reflow step, the finer the mesh size of the GND mesh pattern (the larger a copper line quantity per a unit area), the larger the resiliency of the GND mesh pattern becomes and hence, a residual stress which acts in the direction of restoring an original warped state becomes large thus impeding a warping correction operation.

In view of the above, according to this embodiment, the GND mesh pattern 18 which is formed for realizing impedance matching (that is, a condition required in accordance with transmission rules of high-speed differential signals) is not formed on the whole flexible printed circuit board 5, but is formed in a minimum region. Due to such constitution, it is possible to suppress physical behaviors (a bending repulsive force, a restoring force after correction or the like) of the flexible printed circuit board 5 and, at the same time, the GND mesh pattern 18 having such constitution can contribute to the reduction of a manufacturing cost.

Here, the above-mentioned minimum region where the GND mesh pattern 18 is formed may preferably be a region in which the GND mesh pattern 18 covers the positive signal line 31, and the negative signal line 32 which constitute a pair line and the pair of GND lines 35 which is formed outside the positive signal line 31 and the negative signal line 32 which constitute the pair line in FIG. 6.

Figure 5:
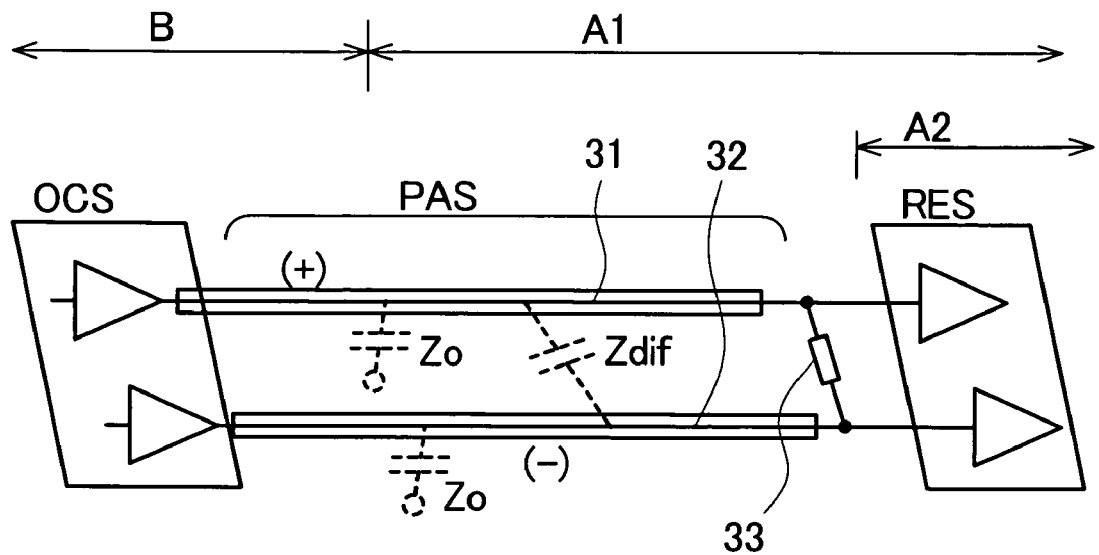
FIG. 5 is a view for explaining a transmission method of high-speed differential signals.

Assume a case in which the high-speed differential signal lines are arranged on the first surface of the flexible printed circuit board 5 in accordance with the transmission circuit rules of the high-speed differential signals explained in conjunction with FIG. 5 and FIG. 6 such that the high-speed differential signal lines arrive at connection terminals (interface terminals) of the connection terminal portion 10 which are connected with the phone body portion. In such a case, when either one of a ZIF-type connector or a stacking-type connector is used as the external connector, the positive signal line 31 and the negative signal line 32 which constitute each pair are separated to left and right sides of the external connector by contact pins arranged in the inside of the external connector thus giving rise to a drawback that impedance mismatching is generated in the high-speed differential signals.

Figure 7:
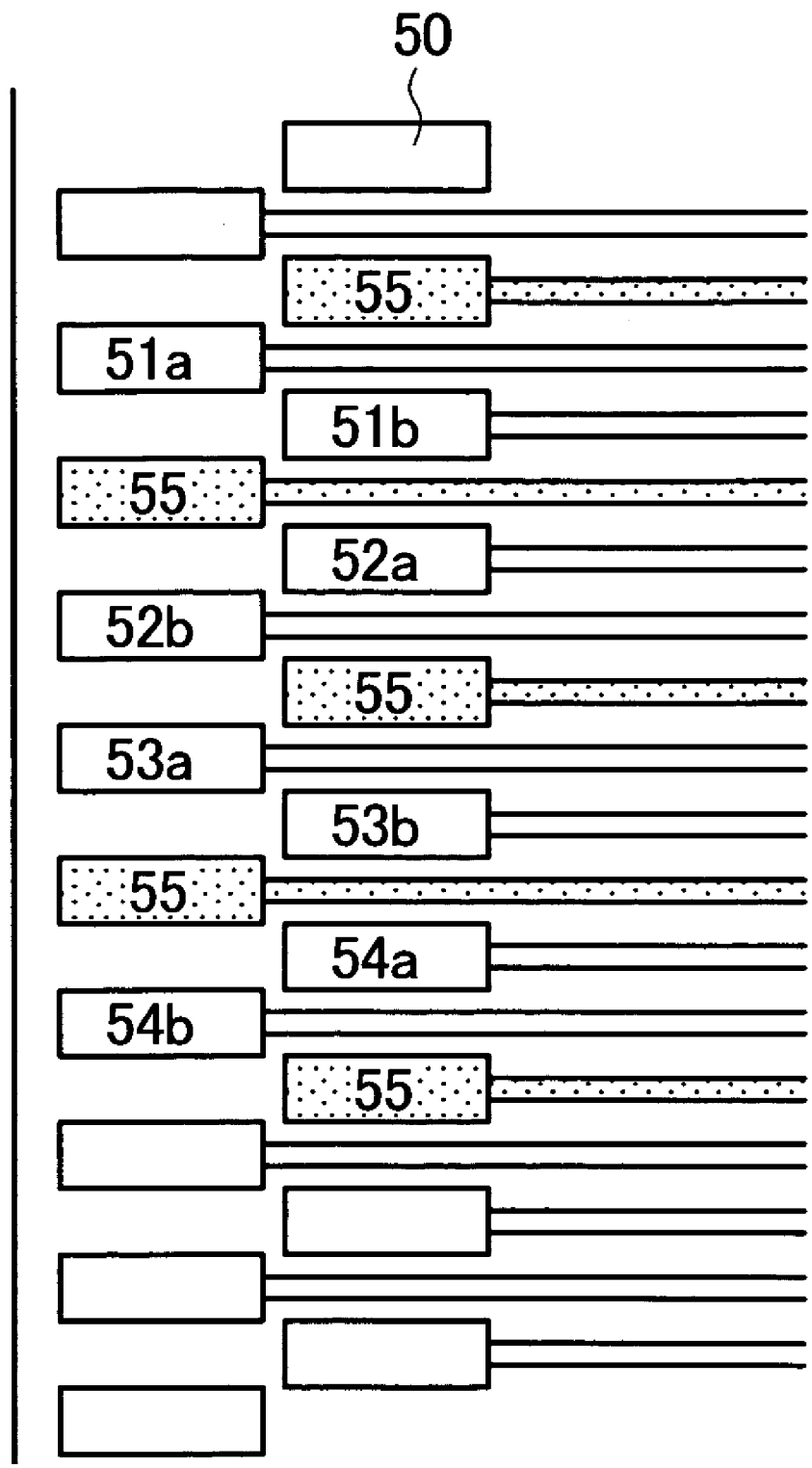
FIG. 7 is a view showing an arrangement state of respective lines at a connection terminal portion of the flexible printed circuit board shown in FIG. 3 and FIG. 4.

This drawback is explained in detail hereinafter. FIG. 7 shows an arrangement state of respective lines at the connection terminal portion 10 of the flexible printed circuit board shown in FIG. 3 and FIG. 4.

In FIG. 7, symbols 51a to 54a indicate four sets of positive signal lines for high-speed differential signals (corresponding to lines 31 in FIG. 6), symbols 51b to 54b indicate four sets of negative signal lines of high-speed differential signals (corresponding to lines 32 in FIG. 6), and symbol 55 indicates GND lines (corresponding to lines 35 in FIG. 6) which are arranged on both sides of the positive signal line (51a, 52a, 53a, 54a) and the negative signal line (51b, 52b, 53b, 54b) of each pair.

Here, the positive signal line (51a, 52a, 53a, 54a) and the negative signal line (51b, 52b, 53b, 54b) of each pair and the connection terminal 50 of the GNP line 50 are arranged in a staggered manner.

Figure 8:
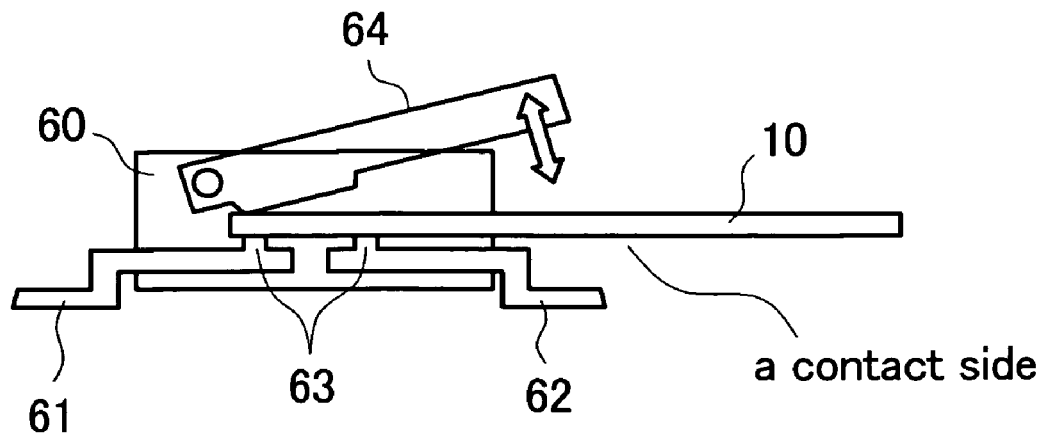
FIG. 8 is a view for explaining a conventional external connector (for example, a ZIF-type connector or a stacking-type connector)

Further, the connection terminal portion 10 having the constitution shown in FIG. 7 is mounted on an external connector (for example, a ZIF-type connector or a stacking-type connector) 60 shown in FIG. 8. In FIG. 8, numeral 61 indicates an odd-numbered pin, numeral 62 indicates an even-numbered pin, numeral 63 indicates contact pins, and numeral 64 indicates an open/close lever.

Figure 9:
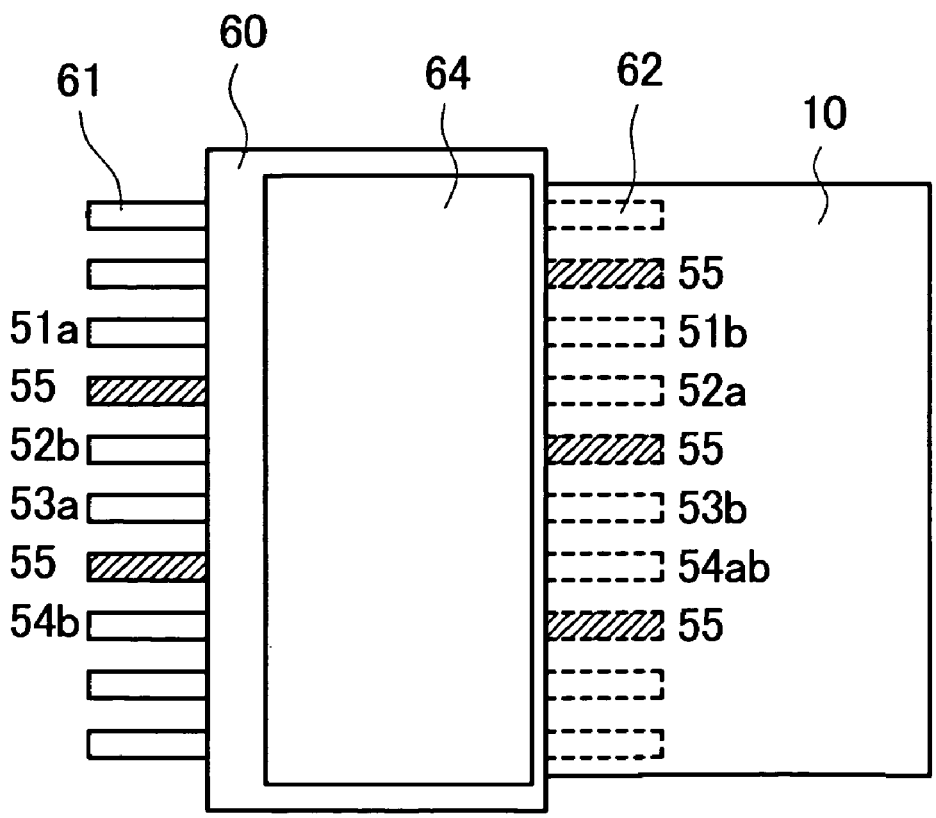
FIG. 9 is a view showing the correspondence between positions of pins of the external connector and positions of the respective lines when the connection terminal portion of the flexible printed circuit board shown in FIG. 7 is connected with the external connector shown in FIG. 8.

In this case, as shown in FIG. 9, on the first surface of the flexible printed circuit board 5, the positive signal line (51a, 52a, 53a, 54a) and the negative signal line (51b, 52b, 53b, 54b) of each pair which are arranged adjacent to each other are separated to left and right sides of the external connector 60 by the contact pins 63 arranged in the inside of the external connector 60.

That is, the positive signal line (51a) is made to correspond to the odd-numbered pin 61 of the external connector 60, and the negative signal line (51b) is made to correspond to the even-numbered pin 62 of the external connector 60. In the same manner, the positive signal line (52a) is made to correspond to the even-numbered pin 62 of the external connector 60, and the negative signal line (52b) is made to correspond to the odd-numbered pin 61 of the external connector 60, the positive signal line (53a) is made to correspond to the odd-numbered pin 61 of the external connector 60, and the negative signal line (53b) is made to correspond to the even-numbered pin 62 of the external connector 60, the positive signal line (54a) is made to correspond to the even-numbered pin 62 of the external connector 60, and the negative signal line (54b) is made to correspond to the odd-numbered pin 61 of the external connector 60.

In this manner, according to the constitution of the connection terminal portion 10 of the conventional flexible printed circuit board 5, on the first surface of the flexible printed circuit board 5, with respect to the positive signal line and the negative signal line of each pair which are arranged adjacent to each other, at a point of time that these lines are connected with the external connector 60, the positive signal line and the negative signal line of each pair are spaced apart from each other thus largely destroying impedance matching of high-speed differential signals.

As described previously, among the commercially available external connectors, there has been known the connector exclusively used for high-speed differential signals which is constituted of the metal-made shield cover or the like. With the use of such a connector, it is possible to obviate the drawback that the positive signal line and the negative signal line which constitute the high-speed differential lines are separated to left and right sides of the external connector by the contact pins so that impedance mismatching of high-speed differential signals is generated. However, mounting of the connector used exclusively for the high-speed differential signals in portable equipment such as a mobile phone has drawbacks in view of the increase of a size and a specification of the portable equipment.

Figure 10:
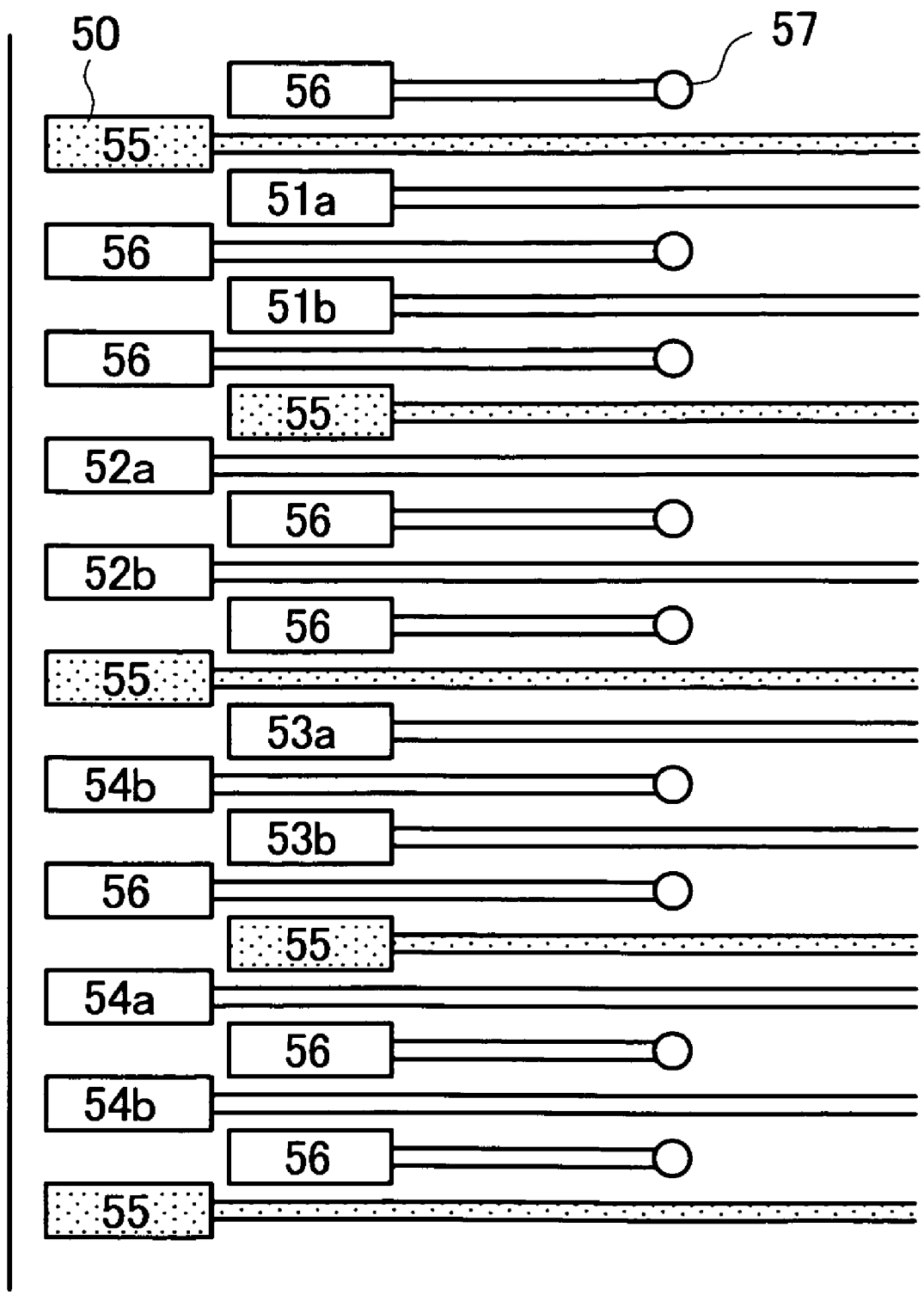
FIG. 10 is a view showing one example of an arrangement state of respective lines in the connection terminal portion of the flexible printed circuit board according to the embodiment of the present invention.

FIG. 10 shows one example of an arrangement state of respective lines at a connection terminal portion 10 of a flexible printed circuit board of this embodiment.

As shown in FIG. 10, also in this embodiment, the positive signal line (51a, 52a, 53a, 54a) and the negative signal line (51b, 52b, 53b, 54b) of each pair and the connection terminals 50 of the GND lines 55 are arranged in a staggered manner.

However, in FIG. 10, an additional GND line 56 which constitutes a dummy line is inserted between the positive signal line (51a, 52a, 53a, 54a) and the negative signal line (51b, 52b, 53b, 54b) of each pair, and between the GND line which is arranged between the differential signal lines of each pair which are arranged adjacent to each other and the negative signal line (51b, 52, 53b, 54b) of each pair such that the respective lines are arranged in order of, from above, the additional GND line 56, the GND line 55, the positive signal line (51a), the additional GND line 56, the negative signal line (51b), the additional GND line 56, the GND line 55, the positive signal line (52a), the additional GND line 56, the negative signal line (52b), the additional GND line 56, the GND line 55, the positive signal line (53a), the additional GND line 56, the negative signal line (53b), the additional GND line 56, the GND line 55, the positive signal line (54a), the additional GND line 56, the negative signal line (54b), the additional GND line 56, and the GND line 55.

Here, the additional GND line 56 which constitutes the dummy may be arranged between the positive signal line (51a, 52a, 53a, 54a) and the negative signal line (51b, 52b, 53b, 54b) of each pair, and between the GND line which is arranged between the differential signal lines of each pair which are arranged adjacent to each other and the positive signal line (51a, 52a, 53a, 54a) of each pair.

Here, the additional GND lines 56 are connected with a GND pattern (for example, a planar GND pattern or a GND mesh pattern) which is formed on a side of the flexible printed circuit board 5 opposite to a surface on which the positive signal lines (51a, 52a, 53a, 54a) and the negative signal lines (51b, 52b, 53b, 54b) of the respective pairs are formed via contact holes 57 formed on the flexible printed circuit board 5.

Figure 11:
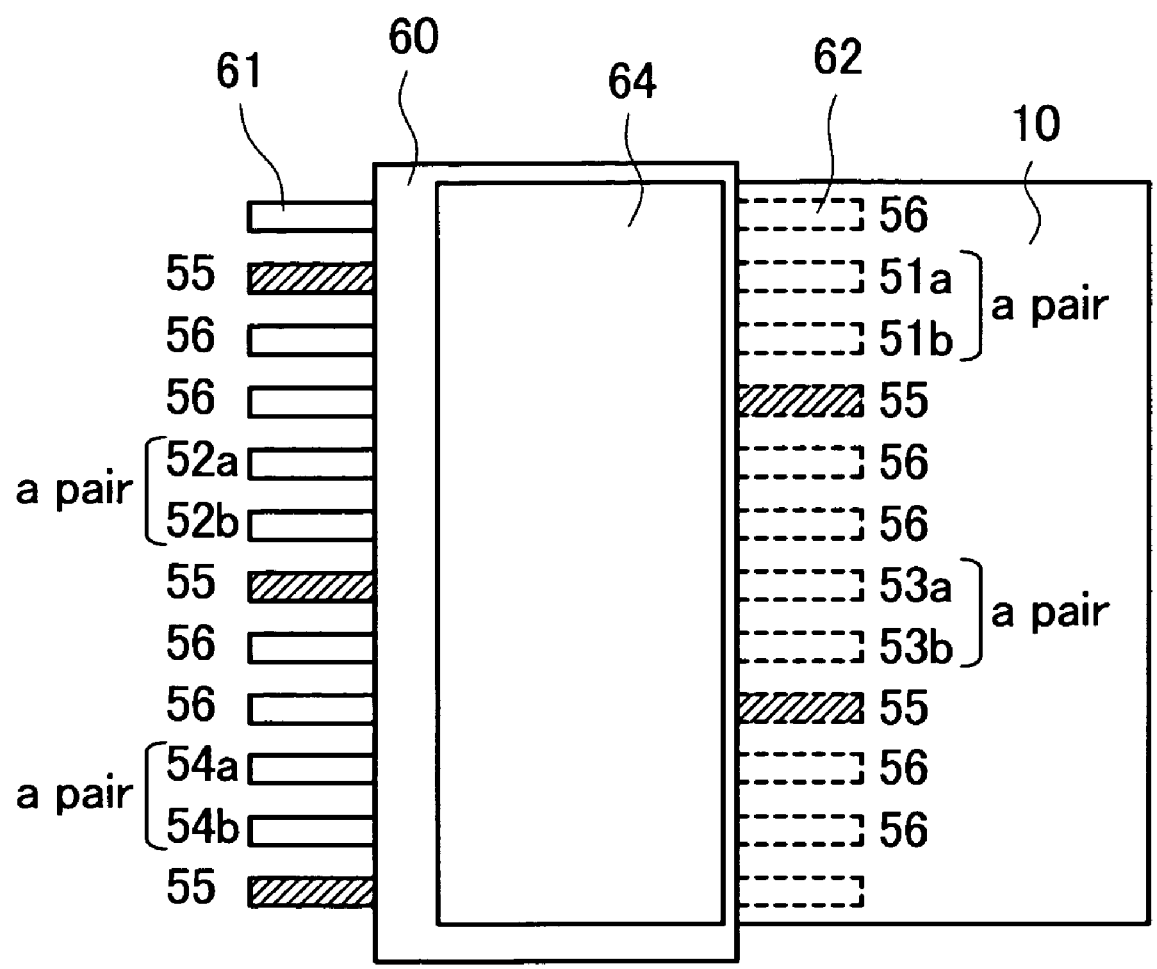
FIG. 11 is a view showing the correspondence between positions of pins of the external connector and positions of the respective lines when the connection terminal portion of the flexible printed circuit board shown in FIG. 10 is connected with the external connector shown in FIG. 8.

Due to such constitution, when the flexible printed circuit board 5 shown in FIG. 10 is mounted on the external connector (for example, the ZIF-type connector or the stacking-type connector) 60 shown in FIG. 8, as shown in FIG. 11, the positive signal line (51a) and the negative signal line (51b) are made to correspond to the even-numbered pin 62 and, at the same time, the positive signal line (53a) and the negative signal line (53b) are made to correspond to the even-numbered pin 62, and the GND lines are made to correspond to the pins arranged on both sides of these positive and negative signal lines.

Further, the positive signal line (52a) and the negative signal line (52b) are made to correspond to the odd-numbered pin 61 and, at the same time, the positive signal line (54a) and the negative signal line (54b) are made to correspond to the odd-numbered pin 61, and the GND lines are made to correspond to the pins arranged on both sides of these positive and negative signal lines.

Accordingly, in this embodiment, on the flexible printed circuit board 5, with respect to the positive signal line and the negative signal line of each pair which are arranged adjacent to each other, even at the point of time that the signal lines are connected to the external connector 60, there is no possibility that the positive signal line and the negative signal line of each pair are spaced apart from each other thus preventing impedance matching of high-speed differential signals from being destroyed.

Due to such constitution, the reliability of operation of the liquid crystal display panel can be enhanced and, at the same time, with the use of the usual signal-use connector in place of the connector exclusively used for high-speed differential signals, a manufacturing cost of the liquid crystal display panel can be reduced.

Here, as the method of inserting the additional GND lines 56, various combinations are considered besides the insertion method shown in FIG. 10. For example, the additional GND lines 56 may be inserted using a method shown in FIG. 12.

Figure 12:
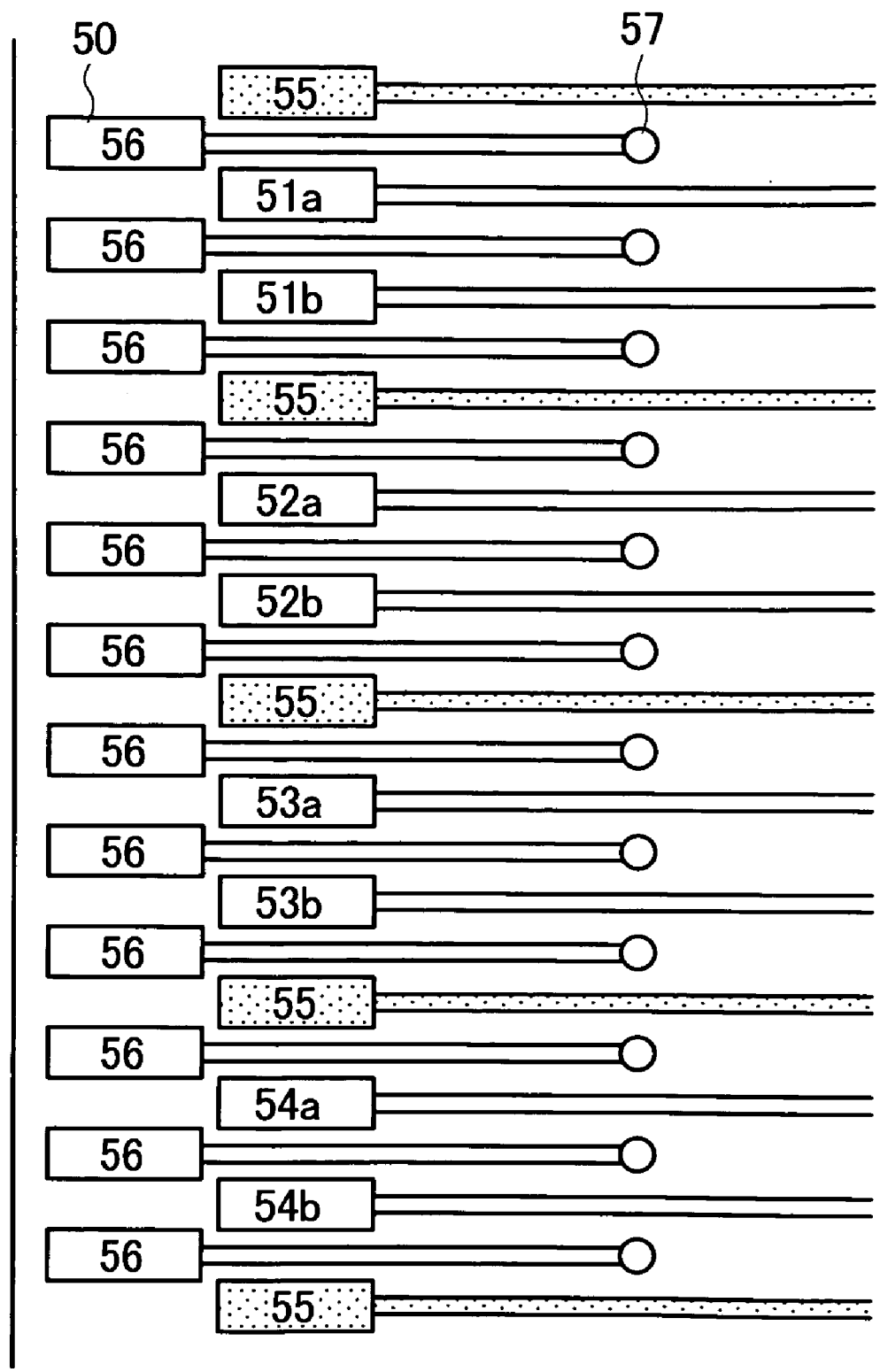
FIG. 12 is a view showing another example of an arrangement state of respective lines at a connection terminal portion of a flexible printed circuit board according to the embodiment of the present invention.

In FIG. 12, the additional GND line 56 which constitutes a dummy line is inserted between the positive signal line (51a, 52a, 53a, 54a) and the negative signal line (51b, 52b, 53b, 54b) of each pair, between the GND line which is arranged between the differential signal lines of each pair which are arranged adjacent to each other and the positive signal line (51a, 52a, 53a, 54a) of each pair, and between the GND line which is arranged between the differential signal lines of each pair which are arranged adjacent to each other and the negative signal line (51b, 52b, 53b, 54b) of each pair such that the respective lines are arranged in order of, from above, the GND line 55, the additional GND line 56, the positive signal line (51a), the additional GND line 56, the negative signal line (51b), the additional GND line 56, the GND line 55, the additional GND line 56, the positive signal line (52a), the additional GND line 56, the negative signal line (52b), the additional GND line 56, the GND line 55, the additional GND line 56, the positive signal line (53a), the additional GND line 56, the negative signal line (53b), the additional GND line 56, the GND line 55, the additional GND line 56, the positive signal line (54a), the additional GND line 56, the negative signal line (54b), the additional GND line 56, and the GND line 55.

Figure 13:
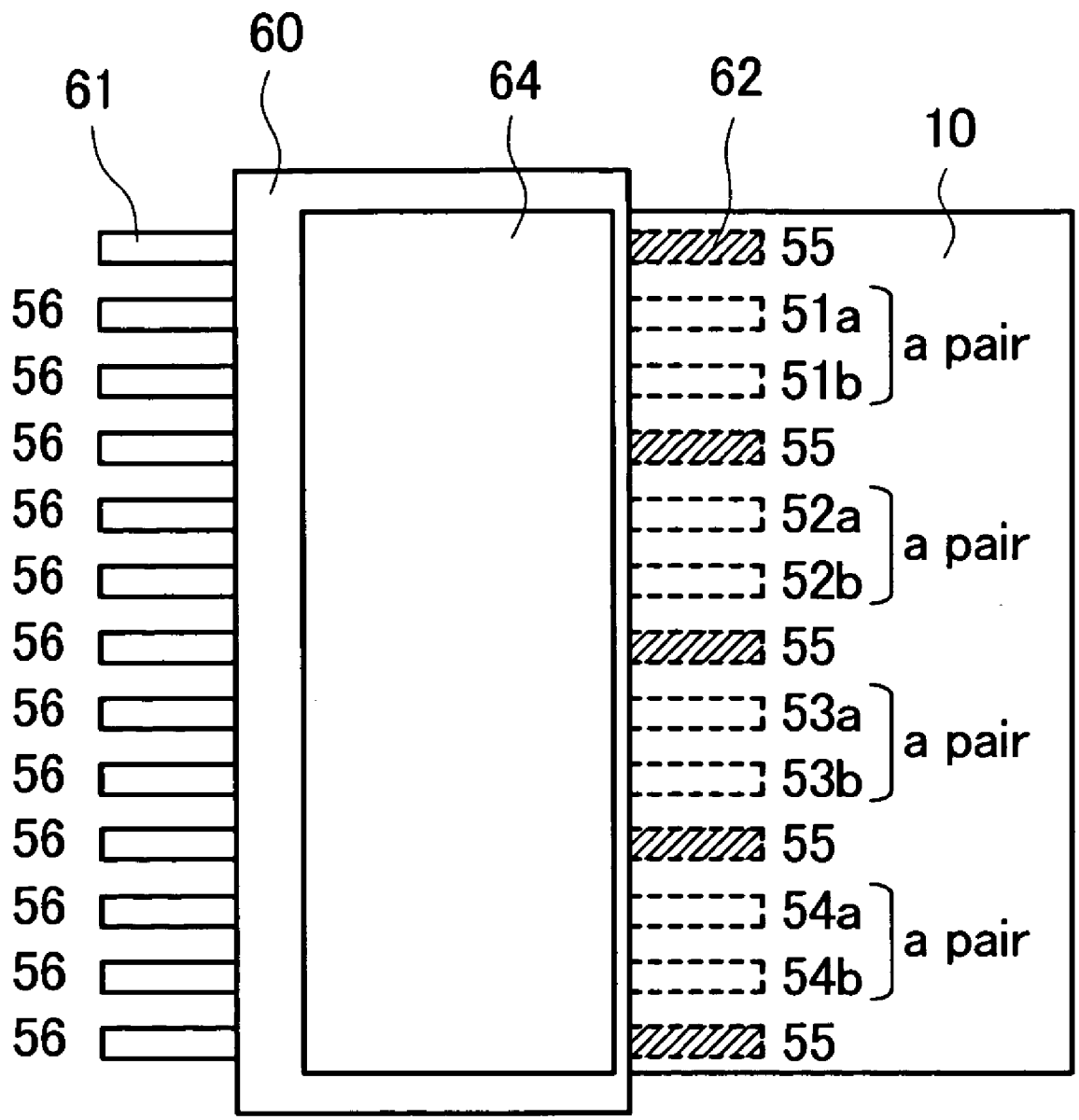
FIG. 13 is a view showing the correspondence between positions of pins of the external connector and positions of the respective lines when the connection terminal portion of the flexible printed circuit board shown in FIG. 12 is connected with the external connector shown in FIG. 8.

Due to such constitution, when the flexible printed circuit board 5 shown in FIG. 10 is mounted on the external connector (for example, the ZIF-type connector or the stacking-type connector) 60 shown in FIG. 8, as shown in FIG. 13, the positive signal line (51a, 52a, 53a, 54a) and the negative signal line (51b, 52b, 53b, 54b) of each pair and the GND lines 55 are made to correspond to pins (odd-numbered pins 61 or even-numbered pins 62) on one side of the external connector and, at the same time, the pins arranged on both sides of these pins are made to correspond to these GND lines.

FIG. 14 shows a modification of the flexible printed circuit board 5 of this embodiment. Here, FIG. 14A shows a first surface of the flexible printed circuit board 5, and FIG. 14B shows a second surface of the flexible printed circuit board 5.

With respect to the above-mentioned flexible printed circuit board 5 shown in FIG. 2 to FIG. 4, the group of high-speed differential signal lines 17 is formed on the first surface of the flexible printed circuit board 5. However, in the flexible printed circuit board 5 shown in FIG. 14, although the group of high-speed differential signal lines 17 is formed on the first surface of the flexible printed circuit board 5 in a first portion of the flexible printed circuit board 5 indicated by numeral 41 in FIG. 14, the group of high-speed differential signal lines 17 is formed on the second surface of the flexible printed circuit board 5 in a second portion which is contiguously formed with a first portion 41 of the flexible printed circuit board 5 indicated by numeral 42 shown in FIG. 14. It is needless to say that the plural pairs of high-speed differential signal lines formed on the first surface of the flexible printed circuit board 5 and the plural pairs of high-speed differential signal lines formed on the second surface of the flexible printed circuit board 5 are connected with each other via contact holes formed in the flexible printed circuit board 5.

Further, a GND mesh pattern 18a and GND mesh patterns other than the GND mesh pattern 18a are formed on only the second surface of the first portion 41 of the flexible printed circuit board 5. Further, a distance (Pa shown in FIG. 14) between the positive signal line 31 and the negative signal line 32 in the first portion 41 of the flexible printed circuit board 5 is set narrower than a distance (Pb shown in FIG. 14) between the positive signal line 31 and the negative signal line 32 in the second portion 42 of the flexible printed circuit board 5 (Pa<Pb) thus acquiring impedance matching in the second portion 42 of the flexible printed circuit board 5.

Here, in the second portion 42 of the flexible printed circuit board 5, the GND pattern (planar GND pattern or GND mesh pattern) 18b is formed on the first surface of the flexible printed circuit board 5, and the additional GND line 56 is connected with the GND pattern 18b via a contact hole 57.

Further, as can be understood from FIG. 14, a width (a length in the direction parallel to a short side of the first substrate 3) of the first portion 41 of the flexible printed circuit board 5 is set larger than a width of the second portion 42 of the flexible printed circuit board 5.

Also with respect to the flexible printed circuit board 5 shown in FIG. 3 and FIG. 4, a first GND pattern 18 for high-speed differential signals may be formed only on the first portion of the flexible printed circuit board 5 (a region corresponding to the portion 41 shown in FIG. 14), and the second GND pattern may be formed on the region other than the first portion of the flexible printed circuit board 5.

In this case also, a distance (corresponding to Pa shown in FIG. 14) between the positive signal line 31 and the negative signal line 32 in the first portion 41 of the flexible printed circuit board 5 is set narrower than a distance (corresponding to Pb shown in FIG. 14) between the positive signal line 31 and the negative signal line 32 in the second portion 42 of the flexible printed circuit board 5 (Pa<Pb) thus acquiring impedance matching in the second portion of the flexible printed circuit board 5 (a region indicated by 42 in FIG. 14).

Here, in the second portion of the flexible printed circuit board 5, the GND pattern (planar GND pattern or GND mesh pattern) is formed on the second surface of the flexible printed circuit board 5, and the additional GND line 56 is connected with the GND pattern 18b via a contact hole 57.

The present invention is not limited to the liquid crystal display device and is, for example, applicable to all kinds of display devices which includes pixels such as an organic EL display device.

Although the invention made by inventors of the present invention has been specifically explained in conjunction with the embodiment heretofore, it is needless to say that the present invention is not limited to the above-mentioned embodiment and various modifications are conceivable without departing from the gist of the present invention.

What is claimed is:

1. A display device comprising:
a display panel having at least a first substrate; and
a flexible printed circuit board which is mechanically and electrically connected with an edge portion of at least one side of the first substrate, wherein
the flexible printed circuit board has a group of differential signal lines including a plurality of pairs of differential signal lines which transmits differential signals,
the flexible printed circuit board includes a first portion having first connection terminals which are electrically and mechanically connected with electrodes formed on the first substrate, and a second portion contiguously formed with the first portion and having second connection terminals which are connected with an external connector,
a pair of GND lines is arranged on both sides of a positive signal line and a negative signal line of each pair of differential signal lines in the first portion and the second portion, and
an additional GND line is arranged at least between the positive signal line and the negative signal line of each pair of the differential signal lines in the second portion.

2. A display device according to claim 1, wherein, in the second portion, the additional GND line is arranged between the positive signal line and the negative signal line of each pair of the differential signal lines, between a GND line which is arranged between the differential signal lines of each pair arranged adjacent to each other and the positive signal line or the negative signal line of one pair of the neighboring respective pairs of differential signal lines.

3. A display device according to claim 1, wherein, in the second portion, the additional GND line is arranged between the positive signal line and the negative signal line of each pair of the differential signal lines, between one of the one pair of the GND lines and the positive signal line of each pair of the differential signal lines, and between another of the one pair of GND lines and the negative signal line of each pair of the differential signal lines.

4. A display device according to claim 1, wherein the positive signal line and the negative signal line of each pair of the differential signal lines, the pair of GND lines, and a second connection terminal of the additional GND line are arranged in a staggered manner.

5. A display device according to claim 1, wherein the group of differential signal lines is formed on a first surface of the flexible printed circuit board, a GND pattern is formed on a second surface of the flexible printed circuit board opposite to the first surface of the flexible printed circuit board, and one end of the additional GND line on a side opposite to the connection terminal of the additional GND line is connected to the GND pattern.

6. A display device according to claim 1, wherein the group of differential signal lines is formed on a first surface of the flexible printed circuit board, a first GND mesh pattern and a second GND mesh pattern are formed on a second surface of the flexible printed circuit board on a side opposite to the first surface of the flexible printed circuit board, the first GND mesh pattern is formed so as to cover at least the group of differential signal lines, one end of the additional GND line on a side opposite to the connection terminal is connected to the first GND mesh pattern, the second GND mesh pattern is formed on a region other than a region where the first GND mesh pattern is formed, and the second GND mesh pattern has a mesh size set larger than a mesh size of the first GND mesh pattern.

7. A display device according to claim 6, wherein the group of differential signal lines is formed on the first surface in the first portion of the flexible printed circuit board and is formed on the second surface in the second portion of the flexible printed circuit board, the first GND mesh pattern and the second GND mesh pattern are formed only in the first portion of the flexible printed circuit board, a third GND pattern is formed on the first surface of the second portion of the flexible printed circuit board, the third GND pattern is formed so as to cover at least a region on which the additional GND line is formed, and one end of the additional GND line on a side opposite to the connection terminal is connected to the third GND pattern.

8. A display device according to claim 1, wherein the group of differential signal lines is formed on a first surface of the flexible printed circuit board, a first GND pattern and a second GND pattern are respectively formed on a first portion and a second portion of a second surface of the flexible printed circuit board on a side opposite to the first surface of the flexible printed circuit board, the first GND pattern and the second GND pattern are not electrically connected with each other, the second GND pattern is formed so as to cover at least a region where the additional GND line is formed, and one end of the additional GND line on a side opposite to the connection terminal is connected to the second GND pattern.

9. A display device according to claim 1, wherein the group of differential signal lines is formed on the first surface in the first portion of the flexible printed circuit board and is formed on the second surface opposite to the first surface in the second portion of the flexible printed circuit board, a first GND pattern and a second GND pattern are respectively formed on the second surface of the first portion of the flexible printed circuit board and the first surface of the second portion of the flexible printed circuit board, the first GND pattern and the second GND pattern are not electrically connected with each other, the second GND pattern is formed so as to cover at least a region where the additional GND line is formed, and one end of the additional GND line on a side opposite to the connection terminal is connected to the second GND pattern.

10. A display device according to claim 7, wherein a distance between the positive signal line and the negative signal line of each pair of the differential signal lines in the first region is set narrower than a distance between the positive signal line and the negative signal line of said each pair of differential signal lines in the second region.

11. A display device according to claim 1, wherein the display device is a liquid crystal display device, and the display panel is a liquid crystal display panel including a first substrate, a second substrate and a liquid crystal layer sandwiched between the first substrate and the second substrate.

* * * * *